United States Patent
Binfet et al.

(10) Patent No.: US 11,915,764 B2
(45) Date of Patent: Feb. 27, 2024

(54) APPARATUS AND METHODS FOR THERMAL MANAGEMENT IN A MEMORY

(71) Applicant: MICRON TECHNOLOGY, INC., Boise, ID (US)

(72) Inventors: Jeremy Binfet, Boise, ID (US); Kishore Kumar Muchherla, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 153 days.

(21) Appl. No.: 17/704,154

(22) Filed: Mar. 25, 2022

(65) Prior Publication Data
US 2023/0326527 A1 Oct. 12, 2023

(51) Int. Cl.
| | |
|---|---|
| *G11C 5/06* | (2006.01) |
| *G11C 16/04* | (2006.01) |
| *G11C 16/10* | (2006.01) |
| *G11C 16/26* | (2006.01) |
| *G11C 16/32* | (2006.01) |

(52) U.S. Cl.
CPC .......... *G11C 16/10* (2013.01); *G11C 16/0483* (2013.01); *G11C 16/26* (2013.01); *G11C 16/32* (2013.01); *G11C 5/063* (2013.01)

(58) Field of Classification Search
CPC .................................................. G11C 29/022
See application file for complete search history.

(56) References Cited

U.S. PATENT DOCUMENTS

| | | | |
|---|---|---|---|
| 7,428,644 B2 | 9/2008 | Jeddeloh et al. | |
| 9,536,625 B1 * | 1/2017 | Quinton | G11C 29/022 |
| 10,360,955 B2 | 7/2019 | Pekny | |
| 10,481,014 B2 | 11/2019 | Bahirat et al. | |
| 10,884,647 B2 | 1/2021 | Tanpairoj et al. | |
| 11,042,208 B2 | 6/2021 | Basu | |
| 11,133,075 B2 | 9/2021 | Blodgett et al. | |
| 11,139,035 B2 | 10/2021 | Cariello | |
| 2014/0281311 A1 | 9/2014 | Walker et al. | |

* cited by examiner

*Primary Examiner* — Jason Lappas
(74) *Attorney, Agent, or Firm* — Dicke, Billig & Czaja, PLLC

(57) ABSTRACT

Memories might include an array of memory cells and a controller for access of the array of memory cells. The controller might be configured to cause the memory to initiate an array operation on the array of memory cells, indicate an unavailability to initiate a next array operation, append a delay interval to an array access time of the array operation, and indicate an availability to initiate a next array operation in response to a completion of the delay interval. The delay interval might have a duration determined in response to an indication of temperature.

23 Claims, 13 Drawing Sheets

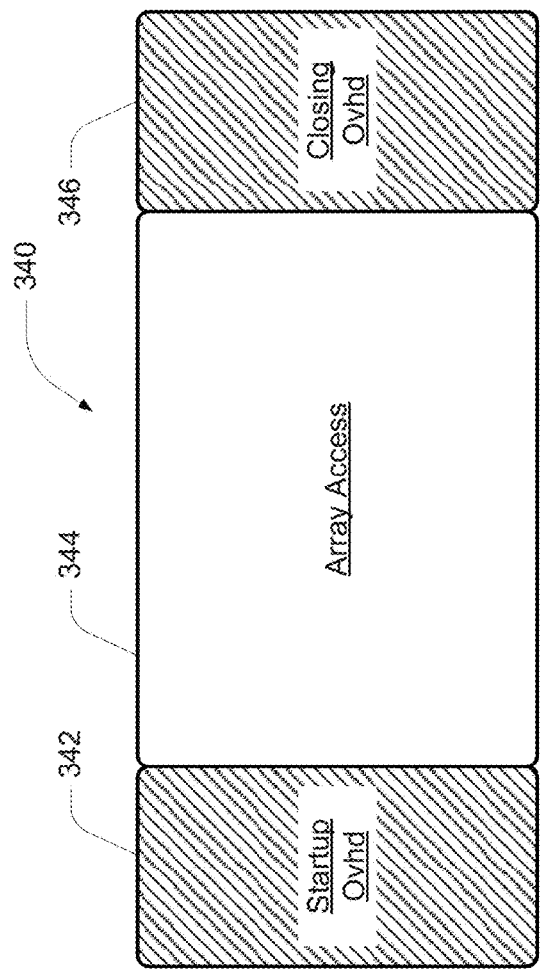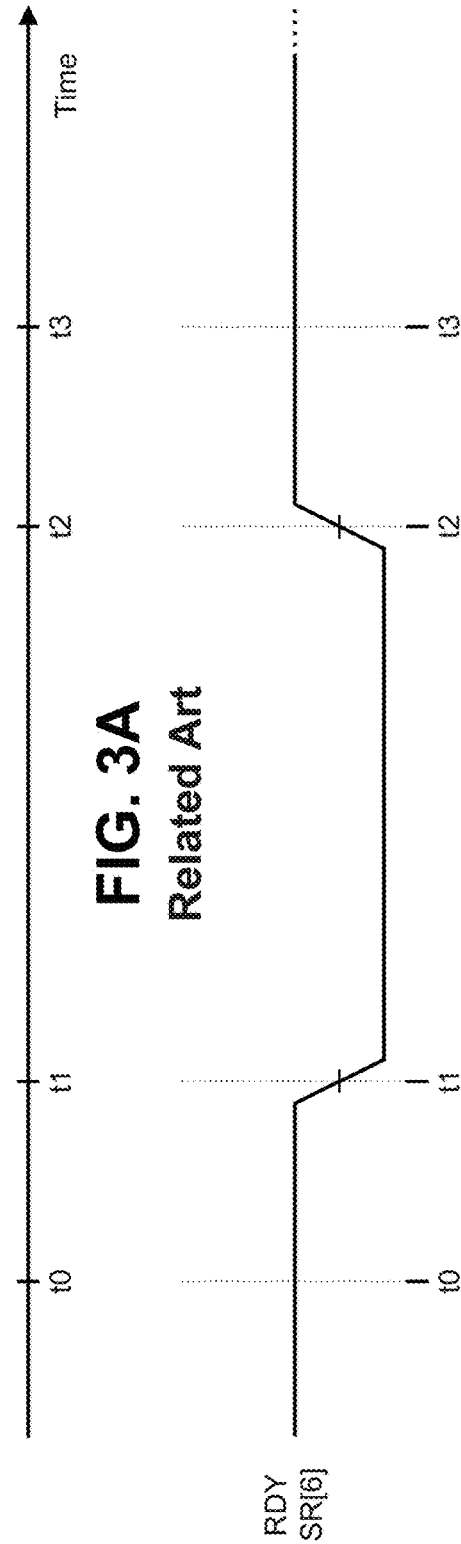
FIG. 3A
Related Art
FIG. 3B
Related Art

APPARATUS AND METHODS FOR THERMAL MANAGEMENT IN A MEMORY

TECHNICAL FIELD

The present disclosure relates generally to memory and, in particular, in one or more embodiments, the present disclosure relates to apparatus and methods for thermal management in a memory.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC might use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

BRIEF DESCRIPTION OF THE DRAWINGS

FIG. 3A depicts a conceptualization of certain events associated with an array operation of the related art.

FIG. 3B depicts a timing diagram of a status indicator associated with the events of FIG. 3A.

DETAILED DESCRIPTION

Figure 1A:
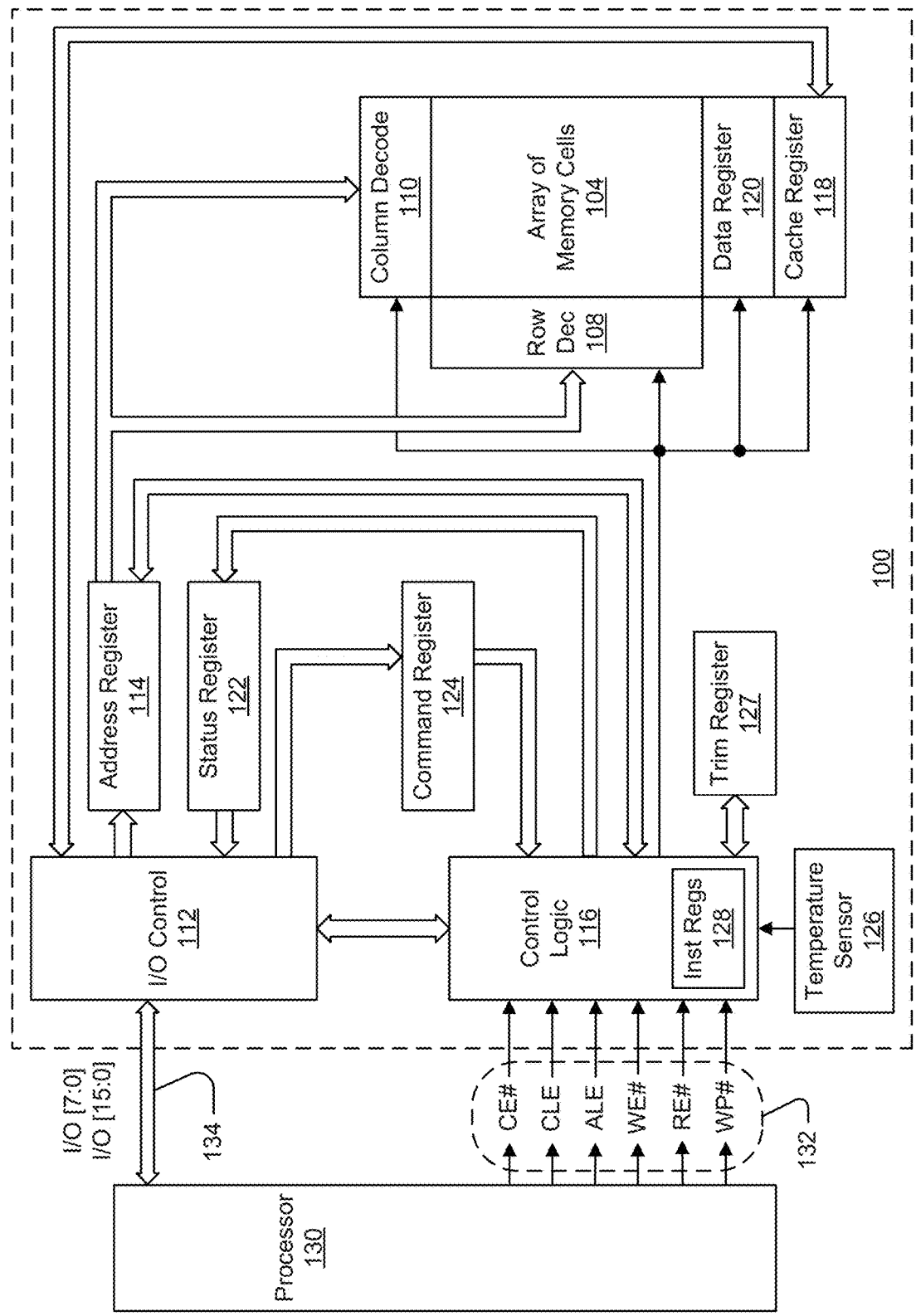
FIG. 1A is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by an electrically conductive path unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

Integrated circuit devices typically generate heat during operation, sometimes at rates that exceed the ability of the device to fully dissipate that heat. Apparatus containing integrated circuit devices typically have specifications regarding maximum operating temperatures. As temperatures increase within the apparatus due to the heat generation, the apparatus might take action to mitigate the temperature increase. For example, a processor might actively limit or throttle concurrent operations (e.g., read, write or other operations) of a number of memories in communication with that processer as the temperature of the processor and/or a memory approaches or exceeds thresholds. Reducing a pace of operations being performed within a system can facilitate a heat generation rate that is equal to or less than the ability of the system to dissipate that heat. Various embodiments facilitate reducing the pace of operations performed within a memory autonomously, e.g., without active control of an external processor, in response to an indication of temperature.

FIG. 1A is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1A) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and might generate status information for the external processor 130, i.e., control logic 116 is configured to perform array operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104, then new data might be latched in the cache register 118 from the I/O control circuitry 112. During a read operation, data might be passed from the cache register 118 to the I/O control circuitry 112 for output to the external processor 130, then new data might be passed from the data register 120 to the cache register 118. The cache register 118 and/or the data register 120 might form (e.g., might form a portion of) a page buffer of the memory device 100. A data register 120 might further include sense circuits (not shown in FIG. 1A) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

The control logic 116 might further be in communication with temperature sensor 126. Temperature sensor 126 might sense a temperature of the memory device 100 and provide an indication to the control logic 116 representative of that temperature, such as some voltage, resistance level, digital representation, etc. Some examples of a temperature sensor 126 might include a thermocouple, a resistive device, a thermistor or an infrared sensor. Alternatively, temperature sensor 126 might be external to memory device 100 and in communication with the external processor 130. In this configuration, temperature sensor 126 might provide an indication of ambient temperature rather than device temperature. Processor 130 could communicate the indication representative of the temperature to the control logic 116, such as across input/output (I/O) bus 134 as a digital representation.

A trim register 127 might be in communication with the control logic 116. The trim register 127 might represent a volatile memory, latches, or other storage location, e.g., volatile or non-volatile. For some embodiments, the trim register 127 might represent a portion of the array of memory cells 104. The trim register 127, in accordance with embodiments, might store information relating to delay intervals as a function of an indicated temperature, such as provided by the temperature sensor 126. Delay intervals might be inserted in array operations, e.g., appended to array access portions of the array operations, in accordance with embodiments.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1A has been simplified. It should be recognized that the functionality of the various block components described with reference to FIG. 1A might not necessarily be segregated to distinct components or component portions of an integrated circuit device. For example, a single component or component portion of an integrated circuit device could be adapted to perform the functionality of more than one block component of FIG. 1A. Alternatively, one or more components or component portions of an integrated circuit device could be combined to perform the functionality of a single block component of FIG. 1A.

Additionally, while specific I/O pins are described in accordance with popular conventions for receipt and output of the various signals, it is noted that other combinations or numbers of I/O pins (or other I/O node structures) might be used in the various embodiments.

Figure 1B:
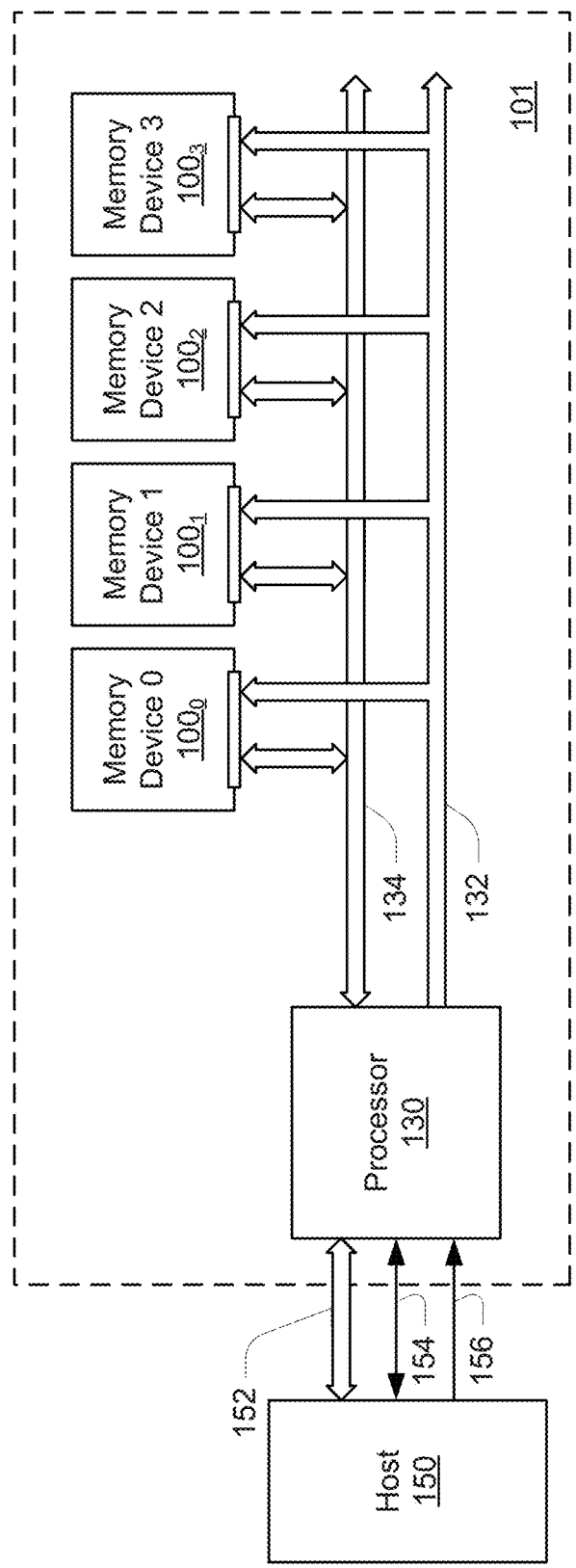
FIG. 1B is a simplified block diagram of an apparatus in the form of a memory module in communication with a host as part of an electronic system, according to another embodiment.

A given processor 130 might be in communication with one or more memory devices 100, e.g., dies. FIG. 1B is a simplified block diagram of an apparatus in the form of a memory module 101 in communication with a host 150 as part of an electronic system, according to another embodiment. Memory devices 100, processor 130, control link 132, and I/O bus 134 may be as described with reference to FIG. 1A. Although memory module (e.g., memory package) 101 of FIG. 1B is depicted with four memory devices 100 (e.g., dies), memory module 101 could have some other number of one or more memory devices 100.

Because processor 130 (e.g., a memory controller) is between the host 150 and the memory devices 100, communication between the host 150 and the processor 130 might involve different communication links than those used between the processor 130 and the memory devices 100. For example, the memory module 101 might be an Embedded MultiMediaCard (eMMC) of a solid state drive (SSD). In accordance with existing standards, communication with an eMMC might include a data link 152 for transfer of data (e.g., an 8-bit link), a command link 154 for transfer of commands and device initialization, and a clock link 156 providing a clock signal for synchronizing the transfers on the data link 152 and command link 154. The processor 130 might handle many activities autonomously, such as power-loss detection, error correction, management of defective blocks, wear leveling, and address translation.

Figure 2A:
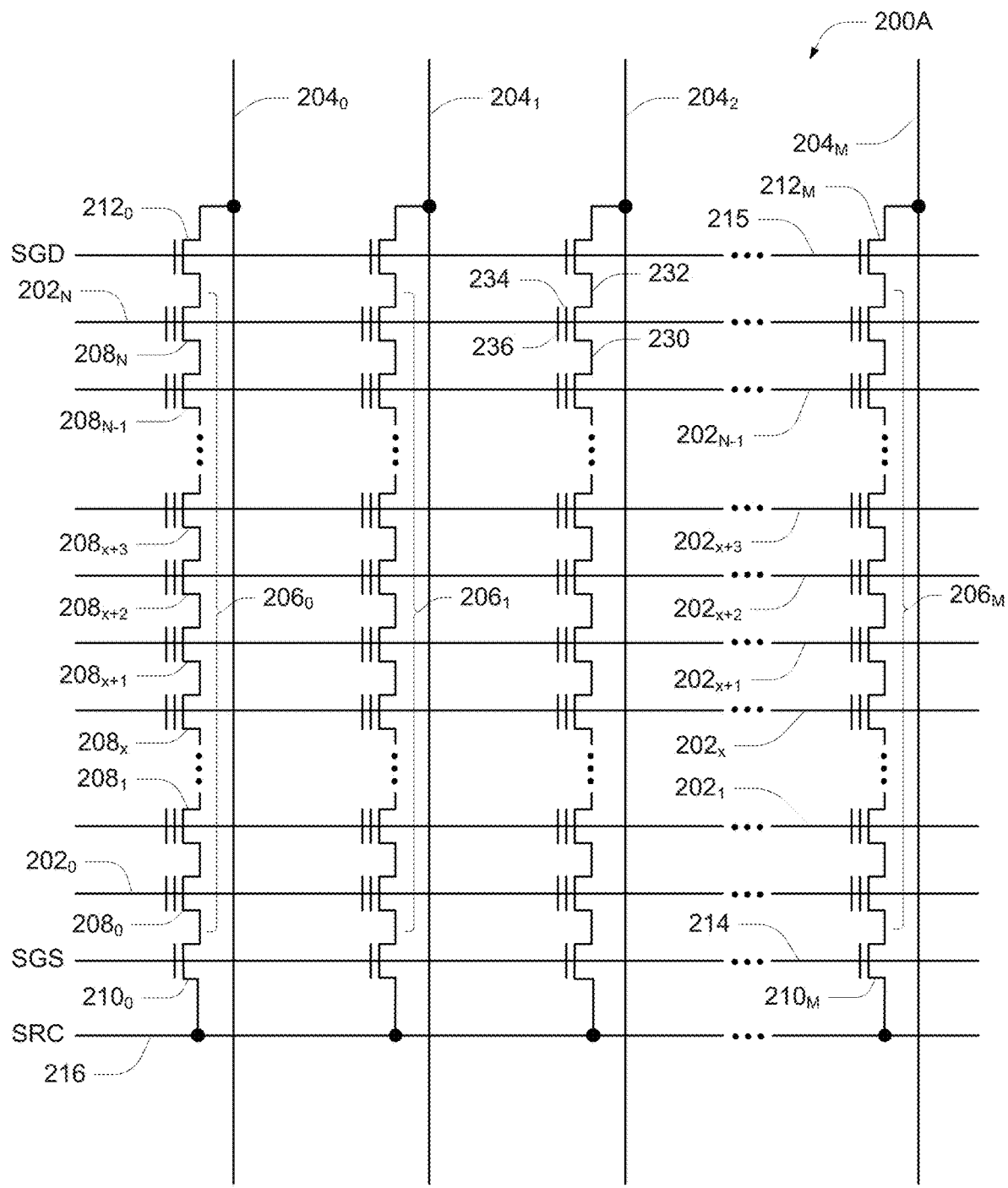
FIGS. 2A-2B are schematics of portions of an array of memory cells as could be used in a memory of the type described with reference to FIG. 1A.

FIG. 2A is a schematic of a portion of an array of memory cells 200A, such as a NAND memory array, as could be used in a memory of the type described with reference to FIG. 1A, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
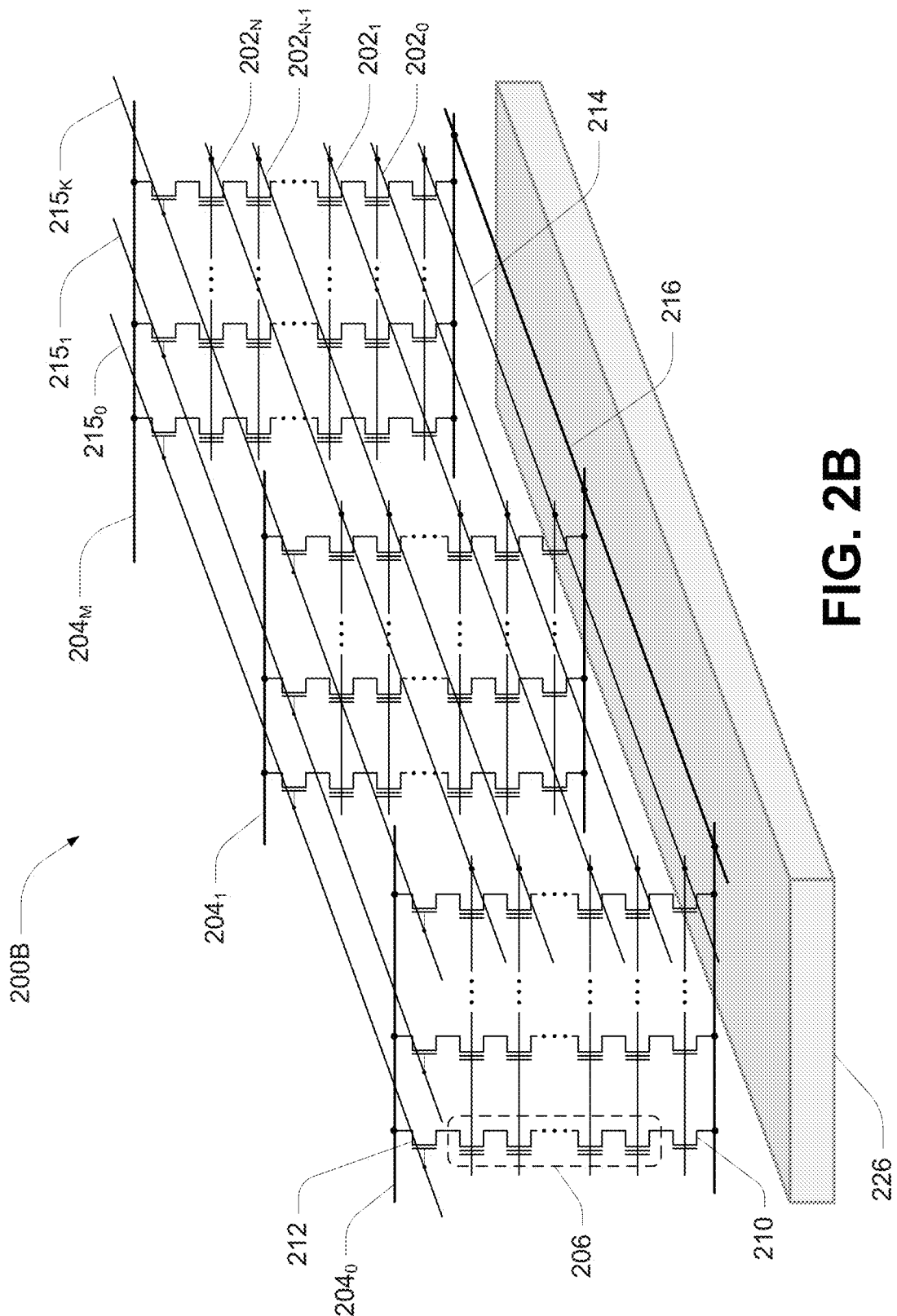

FIG. 2B is another schematic of a portion of an array of memory cells 200B as could be used in a memory of the type described with reference to FIG. 1A, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars, which might be solid or hollow, where a portion of a pillar might act as a channel region of the memory cells of NAND strings 206, e.g., a region through which current might flow when a memory cell, e.g., a field-effect transistor, is activated. The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel region and p-channel region transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

FIG. 3A depicts a conceptualization of certain events associated with an array operation 340 of the related art, while FIG. 3B depicts a timing diagram of a status indicator associated with the events of FIG. 3A. An array operation might represent operations that access the array of memory cells. Array operations might include, for example, read operations, programming operations and/or erase operations. In response to initiating an array operation, e.g., in response to a received command, a memory might indicate that it is busy, e.g., that it is unavailable to initiate a next array operation, e.g., unavailable to accept a command for a next array operation, by setting a status indicator, e.g., a status bit, to a particular value, e.g., a logic low value. In response to the execution of the array operation reaching a point where the memory is available to initiate a next array operation, the memory might then indicate this availability by setting the status indicator to a different value, e.g., a logic high value. For some array operations, an indication that a memory is available to initiate a next array operation might further indicate that the array operation is complete. However, for other array operations, such an indication might not indicate that the memory has completed the array operation. For example, in a read operation utilizing caching of the data output, the memory might be available to initiate a next array operation prior to the completion, or even prior to the commencement, of data output from the memory as data output generally involves peripheral circuitry that can be isolated from the array of memory cells. For such array operations, a second status indicator, e.g., a second status bit, might be used to indicate completion of the array operation.

Generally, before a memory can begin an array access portion of an array operation on an array of memory cells, certain activities might take place to prepare the memory for the array access. The time required to perform such activities might be referred to as startup overhead. As a couple examples, voltage generation devices (e.g., charge pumps) might be activated to generate voltage levels required by the array access, and a temperature of the memory might be sensed to adjust temperature-dependent variables for the array operation. At time t0, the memory might begin performing the startup overhead 342 in response to a command to perform the array operation. The memory might remain available to accept commands for other array operations at this point, such that a status indicator, e.g., a RDY status indicator often referred to as a ready indicator, might remain at an initial, or default, value, e.g., a logic high value as depicted in FIG. 3B. As the memory begins access of the array of memory cells, e.g., array access 344, for the array operation at time t1 after completion of the startup overhead 342, it might pull down the RDY status indicator to a second value, e.g., a logic low value, as depicted in FIG. 3B, indicating that it is busy performing the array operation, e.g., that it is unavailable to initiate a next array operation. At time t2, upon completion of the array access 344, the memory might release the RDY status indicator back to its initial value, indicating that it is again available to initiate a next array operation. Note that for some array operations, the array access 344 might have a variable period of time. For example, read operations encountering errors might have provisions to perform remedial action in an attempt the obtain data that is free of uncorrectable errors, thus leading to variable durations of the array access 344 depending upon the level of errors encountered. Similarly, memory cells are generally known to program at different rates, e.g., different numbers of programming pulses, such that programming operations might also have variable durations dependent upon the speed of programming for different memory cells. After completion of the array access 344, the memory might then perform certain activities to return the memory to some initialization state (i.e., some state from which to begin a next array operation), and/or perform peripheral activity isolated from the array of memory cells, at time t2. The time required to perform such activities might be referred to as closing overhead 346. As a couple examples, the voltage generation devices and analog circuitry of a controller (e.g., internal controller) performing the array access might be deactivated, and, for a read operation, data output might be initiated. At the completion of closing overhead 346 at time t3, the array operation might be deemed to be complete.

Figure 4A:
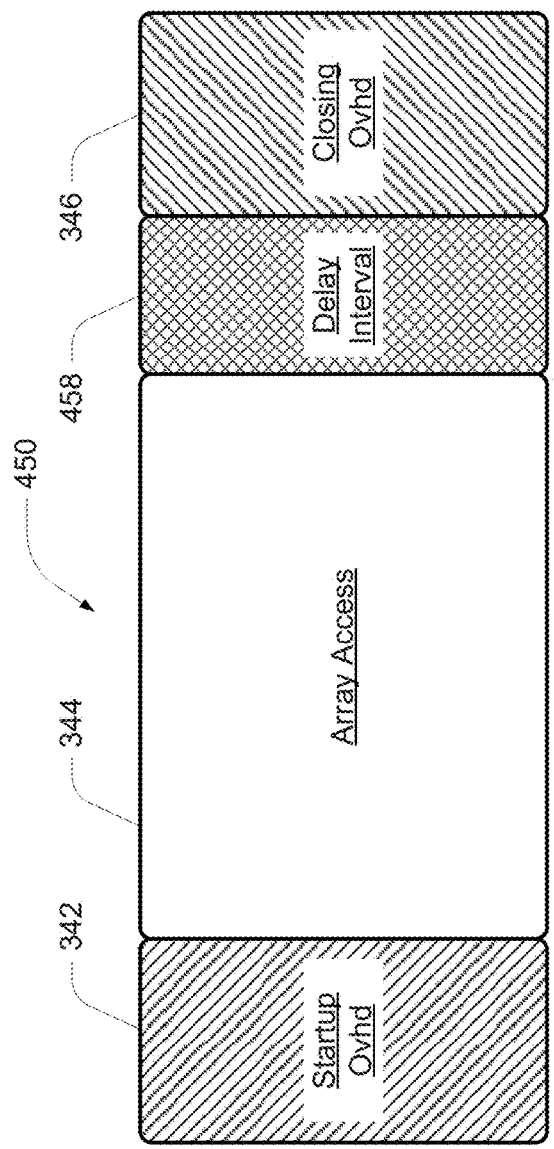
FIG. 4A depicts a conceptualization of certain events associated with an array operation in accordance with an embodiment.
Figure 4B:
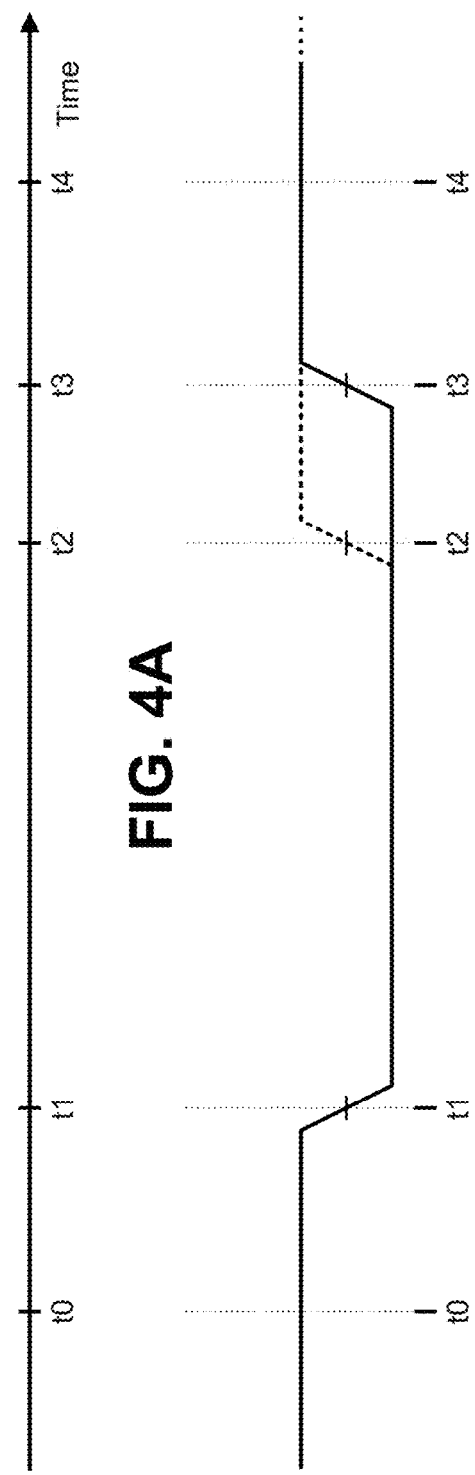
FIG. 4B depicts a timing diagram of a status indicator associated with the events of FIG. 4A.

FIG. 4A depicts a conceptualization of certain events associated with an array operation 450 in accordance with an embodiment, while FIG. 4B depicts a timing diagram of a status indicator associated with the events of FIG. 4A. Like numbered elements in FIG. 4A correspond to the description as provided with respect to FIG. 3A. In contrast to the array operation 340 of FIG. 3A, the array operation 450 of FIG. 4A includes a delay interval 458 appended to the array access 344. The delay interval 458 has a duration that is determined in response to an indication of temperature. In general, the duration of the delay interval 458 might have a positive correlation to temperature, such that higher durations might be associated with higher temperatures.

As with the array operation 340, the array operation 450 might have the memory begin performing the startup overhead 342 at time t0 in response to a command to perform the array operation. The memory might remain available to initiate other array operations at this point, such that a RDY status indicator might remain at an initial, or default, value, e.g., a logic high value as depicted in FIG. 4B. As the memory begins access of the array of memory cells, e.g., array access 344, for the array operation at time t1 after completion of the startup overhead 342, it might pull down the RDY status indicator to a second value, e.g., a logic low value, as depicted in FIG. 4B, indicating that it is busy performing the array access, e.g., that it is unavailable to initiate a next array operation. While the array operation 340 released the RDY status indicator at time t2, as depicted in dotted line in FIG. 4B, the array operation 450 might continue to indicate an unavailability to initiate a next array operation for the duration of the delay interval 458. Following completion of the delay interval 458 at time t3, the memory might release the RDY status indicator back to its initial value, indicating that it is again available to initiate a next array operation. The memory might then perform the closing overhead at time t3. At the completion of closing overhead 346 at time t4, the array operation might be complete.

Figure 5C:
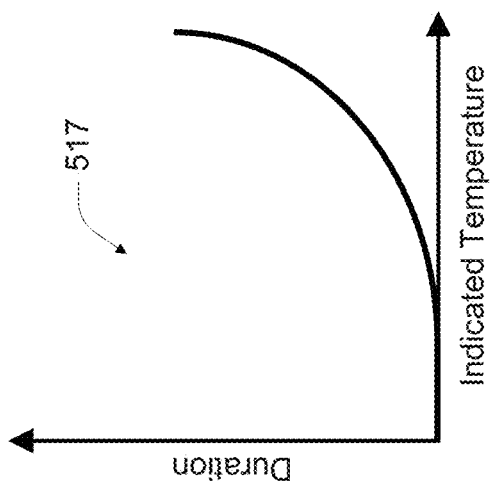
FIG. 5A-5C depict conceptual graphs of positive correlations of delay interval duration as a function of temperature in accordance with embodiments.
Figure 5B:
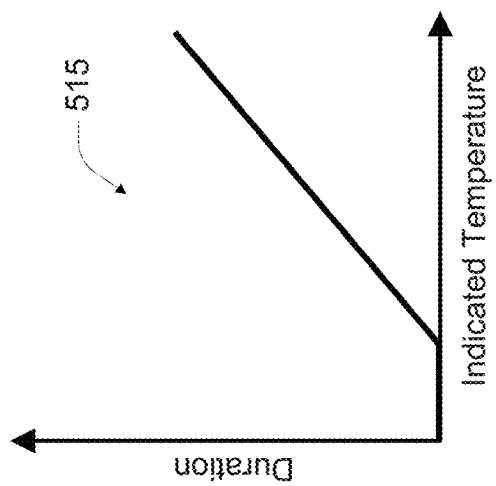
Figure 5A:
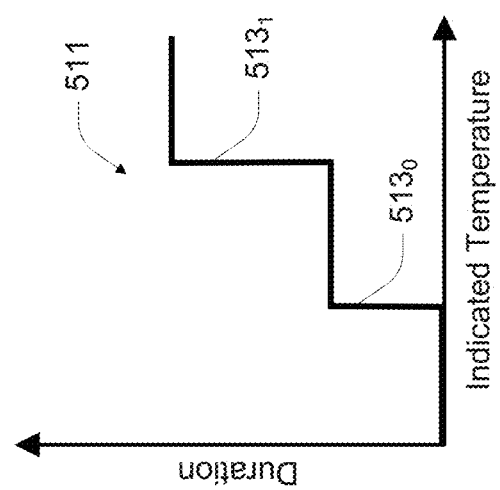

As noted, the duration of the delay interval 458 might have a positive correlation to temperature, e.g., duration as a function of an indicated temperature might be an increasing function. FIG. 5A-5C depict conceptual graphs of positive correlations of delay interval duration as a function of an indicated temperature in accordance with embodiments. The graph of FIG. 5A depicts a step function 511, where the positive correlation of delay interval duration as a function of an indicated temperature includes one or more steps 513 (e.g., steps $513_0$ and $513_1$) to a higher duration when the temperature exceeds a particular value or values. Note that the height of the steps 513 need not be the same. In the example of FIG. 5A, the step $513_1$ is higher than the step $513_0$. The graph of FIG. 5B depicts a linear function 515, where the positive correlation of delay interval duration as a function of an indicated temperature provides a higher duration for each increasing value of the indicated temperature. The graph of FIG. 5C depicts a curvilinear function 517, where the positive correlation of delay interval duration as a function of an indicated temperature provides that a value for the duration for any particular value of the indicated temperature is greater than or equal to the value for the duration for each value of the indicated temperature less than the particular value, and less than or equal to the value for the duration for each value of the indicated temperature greater than the particular value. Other positive correlations of delay interval duration as a function of an indicated temperature are suitable, e.g., such that a value for the delay interval duration for any particular value of the indicated temperature is greater than or equal to the value for the delay interval duration for each value of the temperature less than the particular value, and less than or equal to the value for the delay interval duration for each value of the indicated temperature greater than the particular value.

Stepped functions might represent the use of a look-up table, where the value of the attribute, e.g., delay interval duration, is determined by looking up the value of the indicated temperature in the table and selecting the value of the attribute corresponding to that indicated temperature. Table 1 is a conceptual example of a look-up table for multiple array operations. Alternatively, the value of duration (e.g., D) for an increasing function might be directly calculated from an equation of the increasing function, e.g., D=f(T).

TABLE 1

Delay Interval Duration as Functions of Indicated Temperature for Two Different Array Operations

| Sensed Temperature (T) | Attribute Value of First Array Operation | Attribute Value of Second Array Operation |
|---|---|---|
| T < 85° C. | 0 µs | 0 µs |
| 85° C. <= T < 90° C. | 5 µs | 50 µs |
| 90° C. <= T < 95° C. | 10 µs | 100 µs |
| 95° C. <= T | 20 µs | 200 µs |

While several examples of increasing functions are described with reference to FIGS. 5A-5C, other increasing functions can be used where a value of the duration at some relevant indicated temperature is greater than or equal to the value of the duration at each lower relevant indicated temperature, and less than or equal to the value of the duration at each higher relevant indicated temperature. Increasing functions described herein might, for example, be determined experimentally, empirically or through simulation.

Figure 6A:
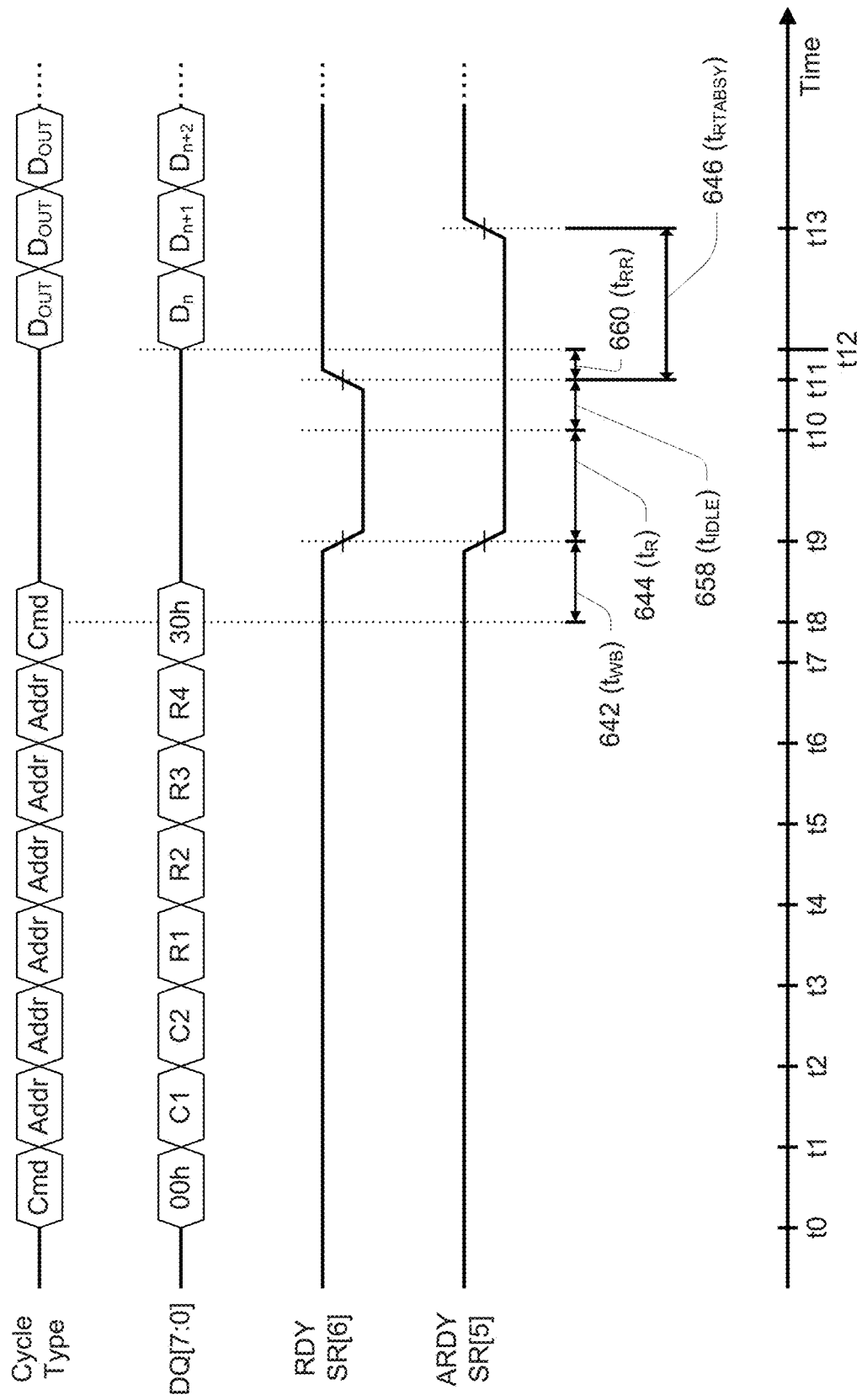
FIG. 6A is a timing diagram for an array operation in accordance with an embodiment.

FIG. 6A is a timing diagram for an array operation in accordance with an embodiment. In the example of FIG. 6A, the array operation might represent a read operation. At time t0, a first cycle of a read command might be received by the memory. In the example of FIG. 6A, the first cycle of the read command is illustrated as 00h. However, the particular command code is provided by way of example, and is, therefore, not to be taken in a limiting sense. At times t1 and t2, a column address might be received by the memory, e.g., a first portion C1 of the column address at time t1 and a second portion C2 of the column address at time t2. The column address might identify target columns of the array of memory cells for the read operation. At times t3-t6, a row address might be received by the memory, e.g., a first portion R1 of the row address at time t3, a second portion R2 of the row address at time t4, a third portion R3 of the row address at time t5, and a fourth portion R4 of the row address at time t6. The row address might identify a target row of the array of memory cells for the read operation. At time t7, a second cycle of the read command might be received by the memory. In the example of FIG. 6A, the second cycle of the read command is illustrated as 30h. However, the particular command code is provided by way of example, and is, therefore, not to be taken in a limiting sense.

A period of time after the command is complete, e.g., after the first and second cycles of the read command are received by the memory in this example, and before the memory device transitions the RDY status indicator (e.g., status register 6, or SR[6]), might correspond to startup overhead 342. For the example read command, this might be referred to as $t_{WB}$. The time $t_{WB}$ 642 might correspond to the period of time from time t8 to time t9.

At time t9, the memory might begin array access 344, e.g., the process of reading the data from the array of memory cells in this example, and might complete the array access 344 at time t10. The period of time from time t9 to time t10 corresponding to the example read command might be referred to as a read time $t_R$, represented as time $t_R$ 644 in FIG. 6A. While the memory device might normally transition its RDY status indicator at this point of the read operation, various embodiments might append a delay interval 458 from time t10 to time t11, represented as time $t_{IDLE}$ 658. A duration of the time $t_{IDLE}$ 658 might be variable and selected in response to an indication of temperature. As noted, the selection might, for example, involve the use of a look-up table, or the direct calculation of the time $t_{IDLE}$. At time t11, following completion of time $t_{IDLE}$ 658 (e.g., the delay interval 458), the memory might transition its RDY status indicator to its initial value, thus indicating that the memory is available to initiate a next array operation, e.g., available to accept a command for a next array operation. Determining the completion of a delay interval 458 might involve a clocked timer reaching a desired count value, as is well understood.

As noted previously, indication that a memory is available to initiate a next array operation may not indicate that the prior array operation is complete. In such circumstances, a memory might utilize a second status indicator, e.g., the status indicator ARDY (e.g., status register 5, or SR[5]). The status indicator ARDY might be referred to as an asynchronous ready indicator. The ARDY status indicator might be transitioned from an initial value, e.g., a logic high value, to a second value, e.g., a logic low value, at time t9 when the RDY status indicator makes a similar transition. However, the ARDY status indicator might remain at its second value until the array operation is complete, and thus might remain at its second value after the RDY status indicator transitions back to its initial value at time t11, indicating that the memory is available to initiate a next array operation. The period of time following the indication that the memory is available to initiate a next array operation, and the completion of the prior array operation might correspond to closing overhead 346. For the example read command, this might be referred to as $t_{RTABSY}$. The time $t_{RTABSY}$ 646 might correspond to the period of time from time t11 to time t13. During time $t_{RTABSY}$ 646, from time t11 to time t12, the memory might prepare for data output, which might be referred to as $t_{RR}$ for the read command of this example, or time $t_{RR}$ 660. Data output might begin at time t12, and might continue after the array operation is deemed to be complete.

Figure 6B:
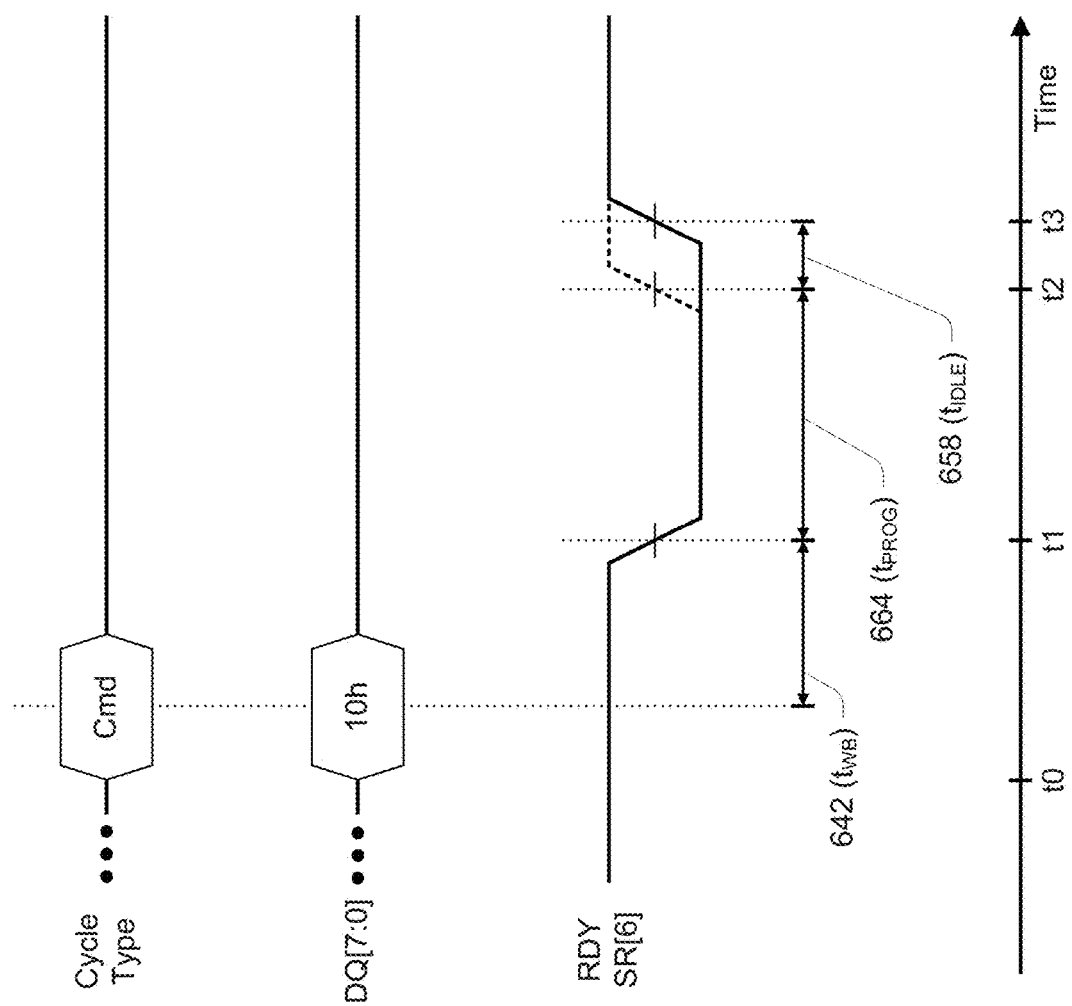
FIG. 6B is an abbreviated timing diagram for a different array operation in accordance with an embodiment.

FIG. 6B is an abbreviated timing diagram for a different array operation in accordance with an embodiment. In the example of FIG. 6B, the array operation might represent a programming operation. The timing diagram of FIG. 6B is abbreviated in that only the second cycle of the command to initiate the programming operation is depicted. It is understood that the second cycle of the command might be proceeded by a first cycle of the command, column address portions, row address portions, and associated data to be programmed to the array of memory cells.

At time t0, a second cycle of programming command (e.g., a write command) might be received by the memory. In the example of FIG. 6A, the second cycle of the read command is illustrated as 10h. However, the particular command code is provided by way of example, and is, therefore, not to be taken in a limiting sense.

A period of time after the command is complete, e.g., after the first and second cycles of the programming command are received by the memory in this example, and before the memory device transitions the RDY status indicator (e.g., status register 6, or SR[6]), might correspond to startup overhead. For the example programming command, this might be referred to as time $t_{WB}$ 642.

At time t2, the memory might begin array access, e.g., the process of programming the received data to the array of memory cells in this example, and might complete the array access portion of the programming operation at time t2. The period of time from time t1 to time t2 corresponding to the example programming command might be referred to as a program time $t_{PROG}$ 644 in FIG. 6B. While the memory device might normally transition its RDY status indicator at this point of the programming operation, various embodiments might append a delay interval from time t2 to time t3, represented as time $t_{IDLE}$ 658. A duration of the time $t_{IDLE}$ 658 might be variable and selected in response to an indication of temperature. As noted, the selection might, for example, involve the use of a look-up table, or the direct calculation of the time $t_{IDLE}$. At time t3, following completion of time $t_{IDLE}$ 658, the memory might transition its RDY status indicator to its initial value, thus indicating that the memory is available to initiate a next array operation, e.g., available to accept a command for a next array operation. Determining the completion of a delay interval 458 might involve a clocked timer reaching a desired count value, as is well understood.

Figure 7:
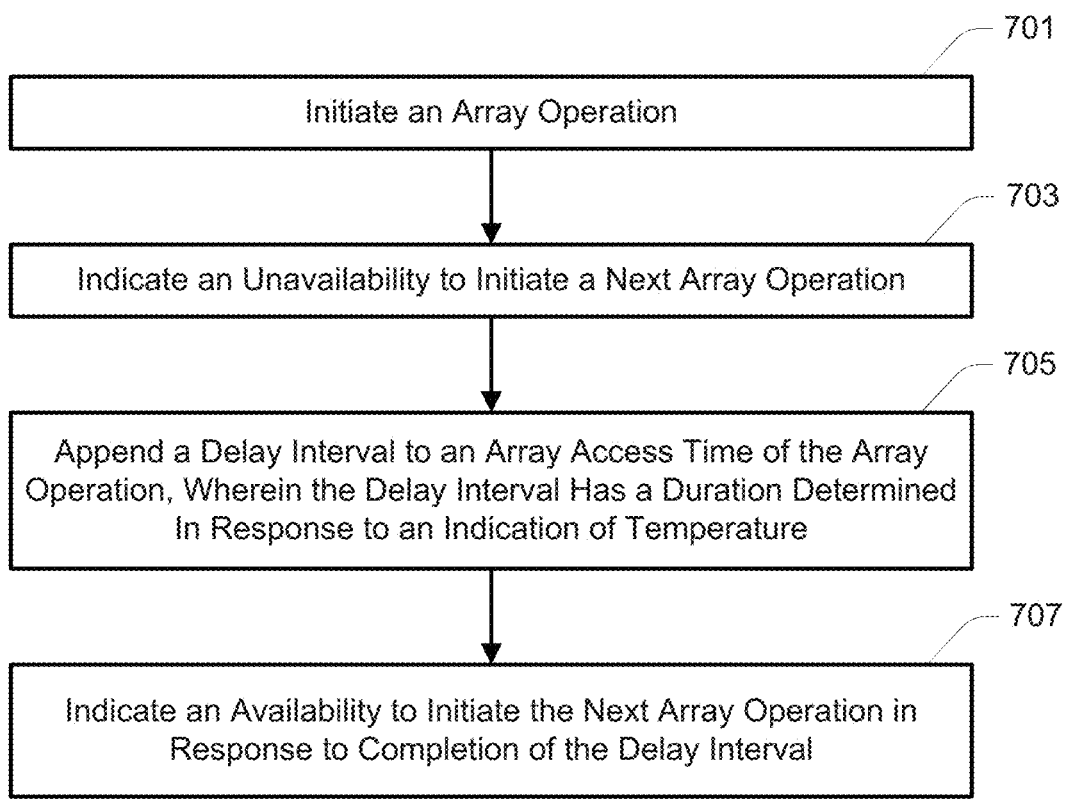
FIG. 7 is a flowchart of a method of operating a memory in accordance with an embodiment.

FIG. 7 is a flowchart of a method of operating a memory in accordance with an embodiment. The method might represent actions associated with an array operation performed by the memory. The method might be in the form of computer-readable instructions, e.g., stored to the instruction registers 128. Such computer-readable instructions might be executed by a controller, e.g., the control logic 116, to cause the relevant components of the memory to perform the method.

At 701, an array operation might be initiated by the memory, e.g., in response to a received command. This might correspond to the initiation of the array operation in response to the received read command, e.g., 00h-30h, completed at time t8 of FIG. 6A. At 703, the memory might indicate that it is unavailable to initiate a next array operation. This might correspond to the execution of an array access portion of the array operation at time t9 of FIG. 6A, and the resulting transition of the RDY status indicator from its initial value to its second value. At 705, a delay interval might be appended to an array access time of the array operation. This might correspond to the time $t_{IDLE}$ 658 appended to the array access time $t_R$ 644 at time t10 of FIG. 6A. The delay interval might have a duration determined in response to an indication of temperature. The duration might have a value selected from both zero or non-zero values, provided the value is determined in response to an indication of temperature. At 707, the memory might indicate an availability to initiate a next array operation in response to completion of the delay interval. This might correspond to the transition of the RDY status indicator from its second value to its initial value at time t11 of FIG. 6A.

Figure 8:
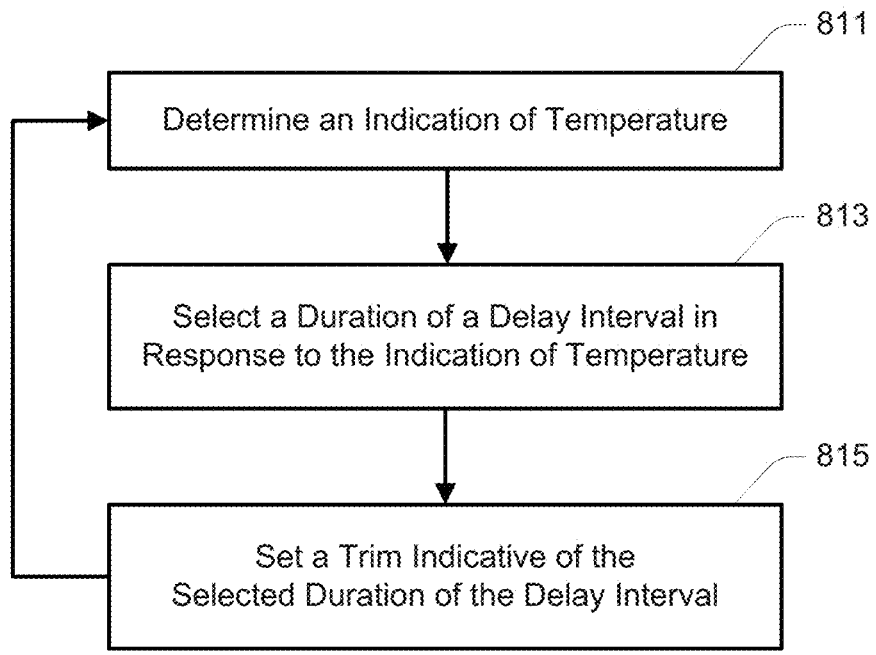
FIG. 8 is a flowchart of a method of operating a memory in accordance with another embodiment.

FIG. 8 is a flowchart of a method of operating a memory in accordance with another embodiment. The method might represent actions associated with an array operation performed by the memory. The method might be in the form of computer-readable instructions, e.g., stored to the instruction registers 128. Such computer-readable instructions might be executed by a controller, e.g., the control logic 116, to cause the relevant components of the memory to perform the method.

At 811, an indication of temperature might be determined. The indication might generally a representative of a temperature being sensed by the temperature sensor 126 and might be, for example, a voltage level indicative of the sensed temperature, a resistance level indicative of the sensed temperature, a digital value indicative of the sensed temperature, etc. For embodiments using a temperature sensor 126 external to the memory, determining the indication of temperature might include receiving the indication of temperature from an external device.

At 813, a duration of a delay interval might be selected in response to the indication of temperature. Selecting the duration of the delay interval in response to the indication of temperature might involve the use of a look-up table, where the value of the duration is determined by looking up the value of the indication of temperature in the table and selecting the value of the duration corresponding to that value of the indication of temperature. For some embodiments, use of a look-up table might further include interpolating between values in the look-up table. For example, presume an indication of temperature corresponded to 93° C. With reference to Table 1, the duration of the delay interval could be selected directly from the look-up table to be 10 μs because 90° C.<=93° C.<95° C. However, as duration of the delay interval is an increasing function of an indication of temperature, it might be desirable to select a duration that more closely reflects a desired level of mitigation. Therefore, using the look-up table with interpolation, the delay interval might be selected to be 16 μs, or (((93° C.−90° C.)/(95° C.−90° C.))*(20 μs−10 μs))+10 μs. Alternatively, the value of the duration might be directly calculated from an equation, e.g., D=f(T).

At 815, a trim indicative of the selected duration of the delay interval might be set. Trims might be used by the memory to set values used by an array operation, e.g., voltage levels, timing characteristics, or, in this case, a duration of a delay interval to be appended to an array access portion of an array operation. The method might then repeat by returning to 811. The method might be repeated on a periodic basis, e.g., repeated on some defined schedule. Alternatively, or in addition, the method might be repeated at the direction of an external device, e.g., by a processor 130 or host 150. Alternatively, the method might be repeated in response to a command to perform an array operation including a delay interval, e.g., prior to initiating an array access portion of the array operation.

Figure 9:
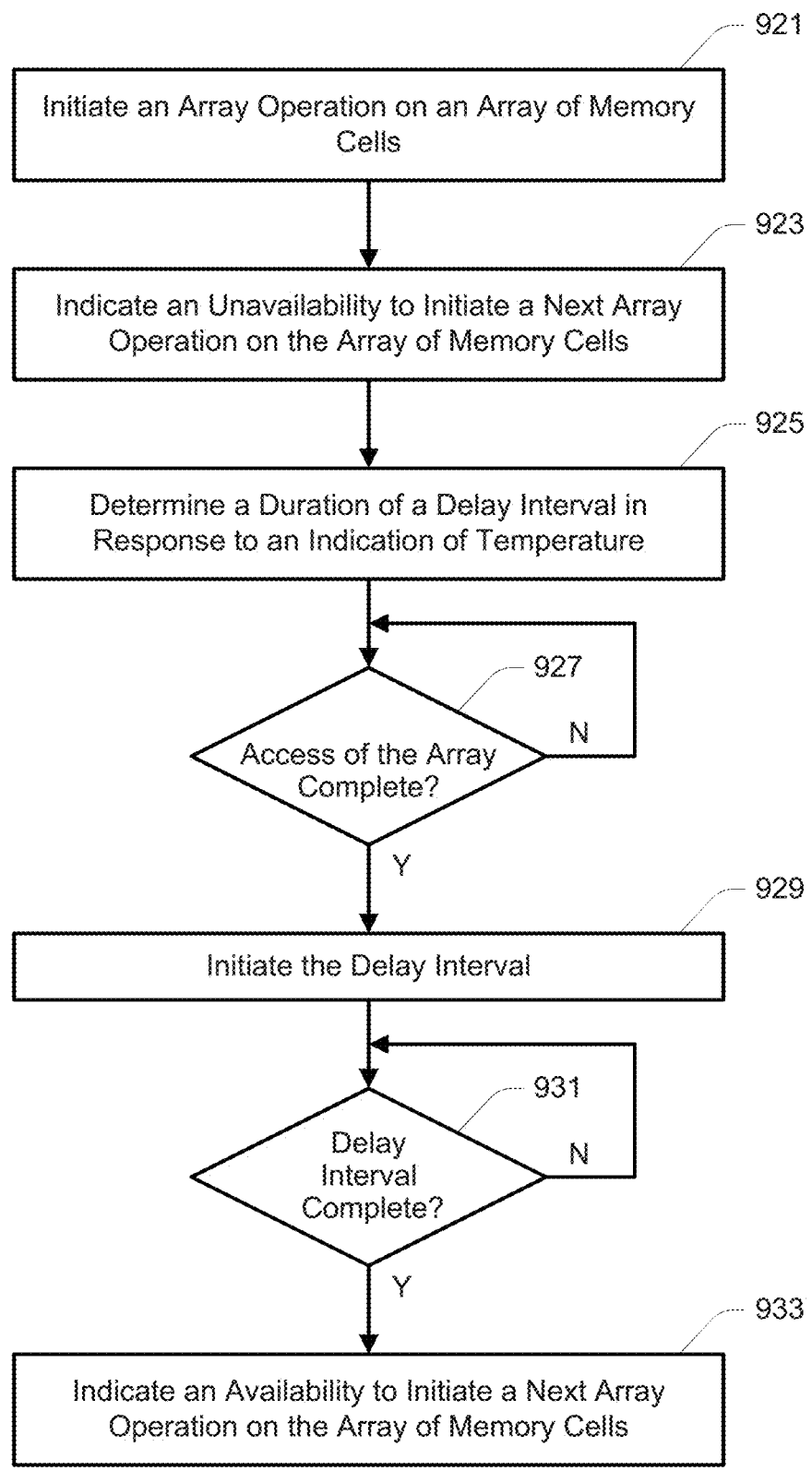
FIG. 9 is a flowchart of a method of operating a memory in accordance with a further embodiment.

FIG. 9 is a flowchart of a method of operating a memory in accordance with a further embodiment. The method might represent actions associated with an array operation performed by the memory. The method might be in the form of computer-readable instructions, e.g., stored to the instruction registers 128. Such computer-readable instructions might be executed by a controller, e.g., the control logic 116, to cause the relevant components of the memory to perform the method.

At 921, an array operation might be initiated on an array of memory cells of the memory. At 923, the memory might indicate, e.g., in response to initiating an array access portion of the array operation, an unavailability to initiate a next array operation on the array of memory cells. This might involve an indication that the memory is unavailable to accept further commands. For example, the RDY status indicator might be transitioned from an initial value, e.g., a logic high value, to a second value, e.g., a logic low value.

At 925, a duration of a delay interval might be determined in response to an indication of temperature. At 927, it might be determined whether the array access portion of the array operation is complete. If not, the method might return to 927. If the array access portion is complete at 927, the method might proceed to 929 and initiate the delay interval. At 931, it might be determined whether the delay interval is complete. If not, the method might return to 931. If the array access portion is complete at 931, the method might proceed to 933 and indicate an availability to initiate a next array operation on the array of memory cells. This might involve an indication that the memory is available to accept further commands. For example, the RDY status indicator might be transitioned from its second value, e.g., a logic low value, to its initial value, e.g., a logic high value.

Figure 10:
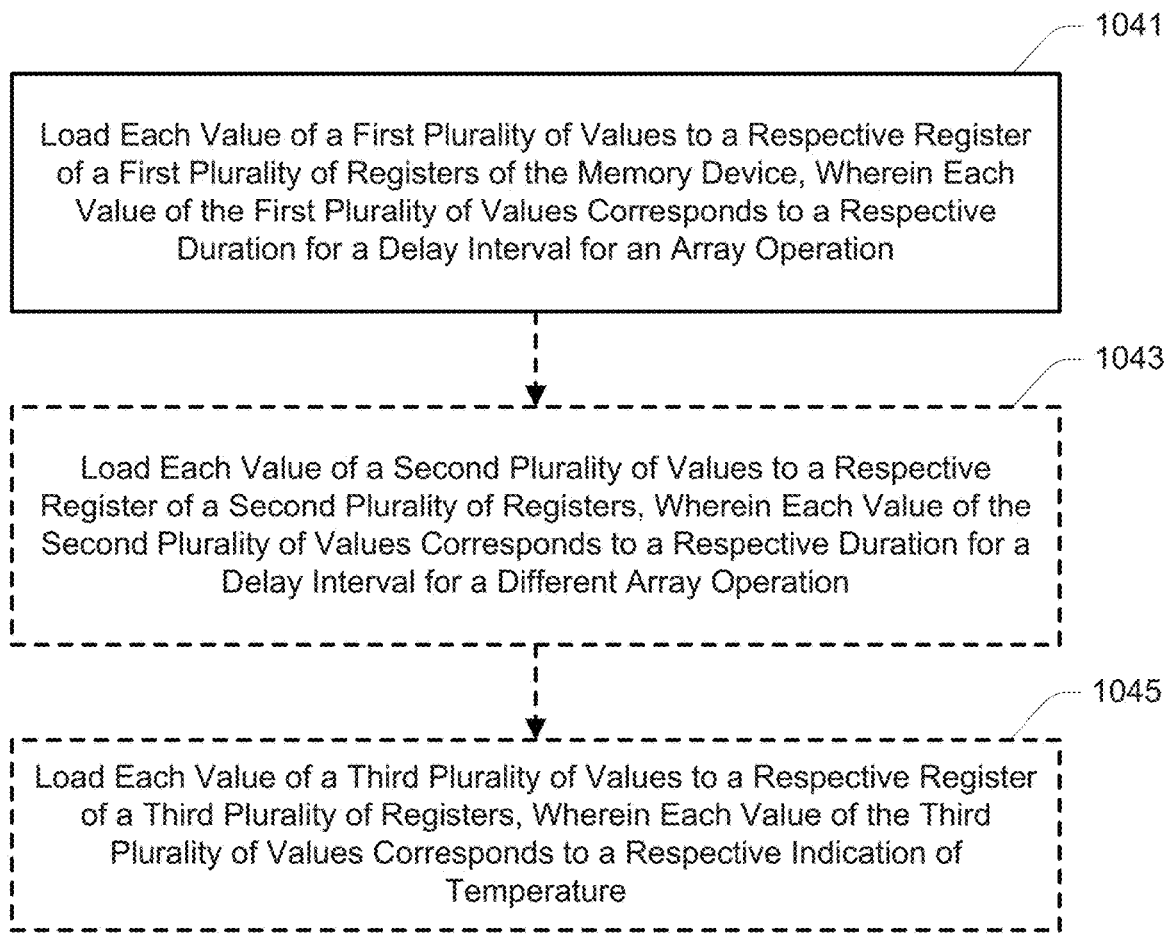
FIG. 10 is a flowchart of a method of operating an apparatus in accordance with a still further embodiment.

FIG. 10 is a flowchart of a method of operating a memory in accordance with a still further embodiment. The method might represent actions associated with initialization of the memory. The method might be in the form of computer-readable instructions, e.g., stored to the instruction registers 128. Such computer-readable instructions might be executed by a controller, e.g., the control logic 116, to cause the relevant components of the memory to perform the method.

At 1041, each value of a first plurality of values might be loaded to a respective register of a first plurality of registers. Each value of the first plurality of values might correspond to a respective duration for a delay interval for an array operation. Optionally, at 1043, each value of a second plurality of values might be loaded to a respective register of a second plurality of registers. Each value of the second plurality of values might correspond to a respective duration for a delay interval for a different array operation. It is noted that different array operations might generate different levels of excess heat, such that different array operations might utilize different delay interval durations to allow the excess heat to dissipate. The process at 1043 might be repeated for one or more additional array operations. Optionally, at 1045, each value of a third plurality of values might be loaded to a respective register of a third plurality of registers. Each value of the third plurality of values might correspond to a respective indication of temperature. For some embodiments, the temperature ranges might be predefined within the memory, such that only the various duration values might be loaded to registers of the memory. For other embodiments, different array operations might select durations for their respective delay intervals in response to different temperature ranges, such that different array operations might correspond to respective indications of temperature loaded to additional respective pluralities of registers.

Each of the values loaded to a respective register might have a corresponding binary assignment. Table 2 might represent an assignment of binary values that could be used to load registers of a memory.

TABLE 2

| Binary Assignments for Indicated Temperature and Delay Interval Duration | | |
|---|---|---|
| Binary Assignment | Indicated Temperature | Delay Interval Duration |
| 000 | 70° C. | 0 µs |
| 001 | 75° C. | 5 µs |
| 010 | 80° C. | 10 µs |
| 011 | 85° C. | 20 µs |
| 100 | 90° C. | 50 µs |
| 101 | 95° C. | 100 µs |
| 110 | 100° C. | 200 µs |
| 111 | 105° C. | 400 µs |

Figure 11:
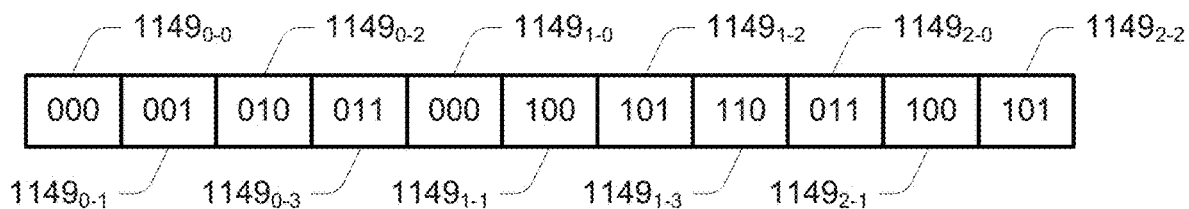
FIG. 11 is a block schematic of a plurality of registers of a memory for use with embodiments.

FIG. 11 is a block schematic of a plurality of registers 1149 of a memory for use with embodiments. The plurality of registers 1149 might store parameters associated with selecting a duration of a delay interval in response to an indication of temperature. Referring back to FIG. 10 at 1041, the first plurality of values might correspond to different durations of a delay interval for use with a first array operation, e.g., a read operation. From Table 1, the different durations of a delay interval for use with its first array operation might be Ops, 5 µs, 10 µs, and 20 µs, which, from Table 2, could be represented as 000, 001, 010, and 011, respectively. Each value of the first plurality of values might thus be loaded to a respective register of a first plurality of registers $1149_{0\text{-}0}$ to $1149_{0\text{-}3}$ as depicted in FIG. 11. For some embodiments, a zero value for a delay interval duration might be presumed for the lowest relevant indicated temperature to be considered, e.g., 85° C. in the example of Table 1. For such embodiments, no register would thus need to be loaded with the zero value duration.

Referring back to FIG. 10 at 1043, the second plurality of values might correspond to different durations of a delay interval for use with a second array operation, e.g., a programming operation. From Table 1, the different durations of a delay interval for use with its second array operation might be 0 µs, 50 µs, 100 µs, and 200 µs, which, from Table 2, could be represented as 000, 100, 101, and 110, respectively. Each value of the second plurality of values might thus be loaded to a respective register of a second plurality of registers $1149_{1\text{-}0}$ to $1149_{1\text{-}3}$ as depicted in FIG. 11.

Referring back to FIG. 10 at 1045, the third plurality of values might correspond to different temperatures to be used for determining durations of a delay interval. From Table 1, the different indicated temperatures might be 85° C., 90° C., and 95° C., which, from Table 2, could be represented as 011, 100, and 101, respectively. Each value of the third plurality of values might thus be loaded to a respective register of a third plurality of registers $1149_{2\text{-}0}$ to $1149_{2\text{-}2}$ as depicted in FIG. 11.

The values of the registers 1149 might be used to build a look-up table, such as that depicted conceptually by Table 1. Although specific delay interval durations for specific ranges of temperature are discussed with reference to specific array operations, other values of temperature and delay interval duration could be used, and will generally be dependent upon the specific heat dissipation characteristics of the memory, and/or the apparatus containing the memory.

Appropriate values might be determined experimentally, empirically or through simulation.

Figure 12:
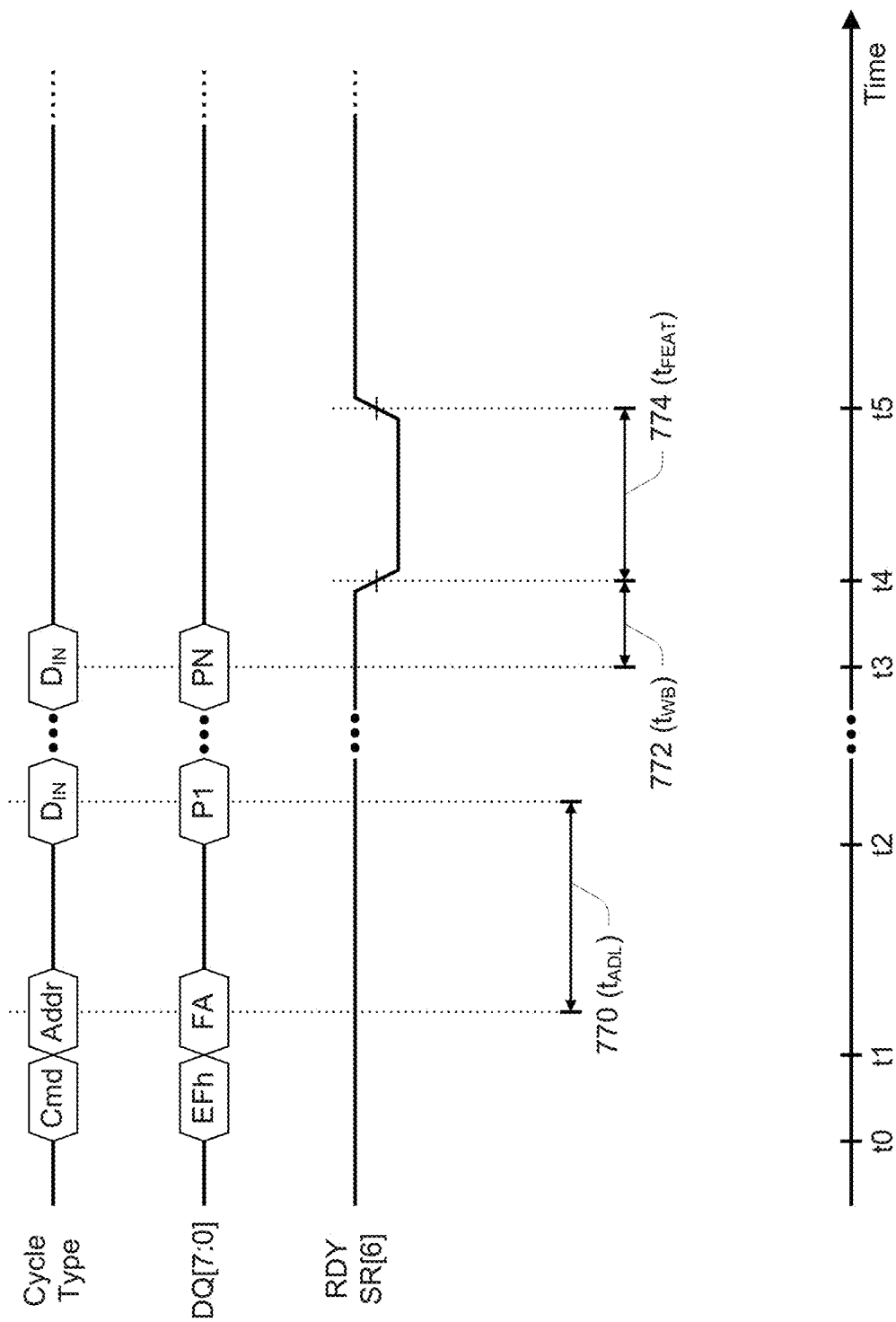
FIG. 12 is a timing diagram for feature setting in a memory in accordance with an embodiment.

FIG. 12 is a timing diagram for feature setting in a memory in accordance with an embodiment. For example, FIG. 12 might represent the activities associated with loading the registers 1149. At time t0, a set feature command might be received by the memory. In the example of FIG. 12, the set feature command is illustrated as EFh. However, the particular command code is provided by way of example, and is, therefore, not to be taken in a limiting sense. At time t1, a feature address might be received by the memory to identify a particular memory (e.g., logical unit) to receive parameters associated with the set feature command. The host might then wait for a period of time $t_{ADL}$ 770, before providing the parameters associated with the set feature command. From time t2 to time t3, parameters P1 through PN might be received by the memory, e.g., in sequence. For the N parameters illustrated, N might be any integer value greater than or equal to two. The parameters might each correspond to a duration of a delay interval. Each duration of a delay interval might correspond to a respective range of temperatures. Following receipt of all parameters P1 through PN associated with the set feature command, the memory might prepare for loading the parameters to their respective registers from time t3 to t4, or time $t_{WB}$ 772. The memory might then indicate at time t4 that it is unavailable to accept additional commands by transitioning the RDY status indicator to its second value, e.g., a logic low value, for a time $t_{FEAT}$ 774 from time t4 to t5.

The respective range of temperatures for each duration of a delay interval might be predefined in the memory. For example, if parameters P1, P2, P3, and P4 corresponded to durations D1, D2, D3, and D4, and the durations had the relationship of D1<D2<D3<D4, the duration D1 might correspond to a range of temperatures less than (e.g., less than or equal to) a predetermined temperature T1, duration D2 might correspond to a range of temperatures greater than (e.g., greater than or equal to) the predetermined temperature T1 and less than (e.g., less than or equal to) a predetermined temperature T2, duration D3 might correspond to a range of temperatures greater than (e.g., greater than or equal to) the predetermined temperature T2 and less than (e.g., less than or equal to) a predetermined temperature T3, and duration D4 might correspond to a range of temperatures greater than (e.g., greater than or equal to) the predetermined temperature T3.

Alternatively, the respective range of temperatures for each duration of a delay interval might be received by the memory device during a same set feature command as used to receive the durations of the delay intervals, or during a separate set feature command. For example, one subset of parameters of a set feature command might each correspond to a duration of a delay interval, and a different (e.g., mutually exclusive) subset of parameters of the set feature command might be used to define the respective range of temperatures for each duration. For example, if parameters P1, P2, P3, and P4 corresponded to durations D1, D2, D3, and D4, and the durations had the relationship of D1<D2<D3<D4, parameters P5, P6, and P7 might have values indicative of temperatures T1, T2, and T3, respectively, where T1<T2<T3. In this manner, duration D1 might correspond to a range of temperatures less than (e.g., less than or equal to) the temperature T1, duration D2 might correspond to a range of temperatures greater than (e.g., greater than or equal to) the temperature T1 and less than (e.g., less than or equal to) the temperature T2, duration D3 might correspond to a range of temperatures greater than (e.g., greater than or equal to) the temperature T2 and less than (e.g., less than or equal to) the temperature T3, and duration D4 might correspond to a range of temperatures greater than (e.g., greater than or equal to) the temperature T3.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. An memory, comprising:
   an array of memory cells; and
   a controller for access of the array of memory cells, wherein the controller is configured to cause the memory to:
   initiate an array operation;
   indicate an unavailability to initiate a next array operation;
   append a delay interval to an array access time of the array operation, wherein the delay interval has a duration determined in response to an indication of temperature; and
   indicate an availability to initiate a next array operation in response to a completion of the delay interval.

2. The memory of claim 1, wherein the controller is further configured to cause the memory to initiate the array operation in response to a received command.

3. The memory of claim 1, wherein the array operation is selected from a group consisting of a read operation, a programming operation, and an erase operation.

4. The memory of claim 3, wherein the array operation is the read operation, and wherein the array access time is the read time ($t_R$) of the read operation.

5. The memory of claim 3, wherein the array operation is the programming operation, and wherein the array access time is the program time ($t_{PROG}$) of the programming operation.

6. The memory of claim 1, wherein the controller is further configured to cause the memory to indicate the unavailability to initiate a next array operation by transitioning a status indicator.

7. The memory of claim 1, wherein the controller is further configured to cause the memory to indicate the unavailability to initiate a next array operation in response to initiating an array access portion of the array operation.

8. The memory of claim 1, wherein the controller is further configured to cause the memory to:
   determine an indication of temperature;
   select the duration of the delay interval in response to the indication of temperature; and
   set a trim indicative of the selected duration of the delay interval to be used by the controller during the array operation.

9. An memory, comprising:
   an array of memory cells; and
   a controller for access of the array of memory cells, wherein the controller is configured to cause the memory to:
   initiate an array operation on the array of memory cells;

indicate an unavailability to initiate a next array operation on the array of memory cells;

determine a duration of a delay interval in response to an indication of temperature;

initiate the delay interval in response to a completion of an array access portion of the array operation; and indicate an availability to initiate a next array operation on the array of memory cells in response to a completion of the delay interval.

10. The memory of claim 9, wherein the controller being configured to cause the memory to indicate the unavailability to initiate a next array operation on the array of memory cells comprises the controller being configured to cause the memory to indicate an unavailability to accept a command.

11. The memory of claim 9, wherein the controller being configured to cause the memory to determine the duration of the delay interval in response to the indication of temperature comprises the controller being configured to cause the memory to determine the duration of the delay interval to have a zero value in response to the indication of temperature indicating a particular temperature, and to determine the duration of the delay interval to have a non-zero value in response to the indication of temperature indicating a temperature higher than the particular temperature.

12. The memory of claim 9, wherein the controller being configured to cause the memory to determine the duration of the delay interval in response to the indication of temperature comprises the controller being configured to cause the memory to use a look-up table.

13. The memory of claim 12, wherein the controller being configured to cause the memory to determine the duration of the delay interval in response to the indication of temperature comprises the controller being configured to cause the memory to interpolate between values of the look-up table.

14. The memory of claim 9, wherein the controller being configured to cause the memory to determine the duration of the delay interval in response to the indication of temperature comprises the controller being configured to calculate the duration of the delay interval in response to an increasing function of the duration as a function of the indication of temperature.

15. The memory of claim 9, wherein the array operation is a first array operation, wherein the indication of temperature is a first indication of temperature, and wherein the controller is further configured to cause the memory to:

initiate a second array operation different than the first array operation on the array of memory cells;

indicate the unavailability to initiate a next array operation on the array of memory cells;

determine a duration of a delay interval for the second array operation in response to a second indication of temperature;

initiate the delay interval for the second array operation in response to a completion of an array access portion of the second array operation; and indicate the availability to initiate a next array operation on the array of memory cells in response to a completion of the delay interval for the second array operation.

16. The memory of claim 15, wherein the first indication of temperature and the second indication of temperature are a same indication of temperature, and wherein the determined duration of the delay interval for the first array operation is different than the determined duration of the delay interval for the second array operation.

17. The memory of claim 15, wherein the first indication of temperature is a different indication of temperature than the second indication of temperature.

18. The memory of claim 17, wherein the controller is further configured to cause the memory to:

determine the first indication of temperature prior to initiating the array access portion of the first array operation; and determine the second indication of temperature prior to initiating the array access portion of the second array operation.

19. An memory, comprising:

an array of memory cells; and a controller for access of the array of memory cells, wherein the controller is configured to perform an array operation on the array of memory cells, and wherein the controller is further configured to cause the memory to:

load each value of a plurality of values to a respective register of a plurality of registers of the memory, wherein each value of the plurality of values corresponds to a respective duration for a delay interval for the array operation.

20. The memory of claim 19, wherein the array operation is a first array operation, wherein the plurality of values is a first plurality of values, wherein the plurality of registers is a first plurality of registers, wherein the controller is further configured to perform a second array operation on the array of memory cells different than the first array operation, and wherein the controller is further configured to cause the memory to:

load each value of a second plurality of values to a respective register of a second plurality of registers of the memory, wherein each value of the second plurality of values corresponds to a respective duration for a delay interval for the second array operation.

21. The memory of claim 19, wherein the plurality of values is a first plurality of values, wherein the plurality of registers is a first plurality of registers, and wherein the controller is further configured to cause the memory to:

load each value of a second plurality of values to a respective register of a second plurality of registers of the memory, wherein each value of the second plurality of values corresponds to a respective indication of temperature; and generate a look-up table for determining a delay interval duration for the array operation as a function of an indication of temperature in response to the first plurality of values and the second plurality of values.

22. The memory of claim 21, wherein the array operation is a first array operation, wherein the controller is further configured to perform a second array operation on the array of memory cells different than the first array operation, and wherein the controller is further configured to cause the memory to:

load each value of a third plurality of values to a respective register of a third plurality of registers of the memory, wherein each value of the third plurality of values corresponds to a respective duration for a delay interval for the second array operation; and further generate the look-up table for determining the delay interval duration for the array operation as a function of the indication of temperature, and for determining a delay interval duration for the second array operation as a function of the indication of temperature, in response to the first plurality of values, the second plurality of values, and the third plurality of values.

23. The memory of claim 19, wherein the controller is configured to cause the memory to load each value of the plurality of values during an initialization of the memory.

\* \* \* \* \*